(12) United States Patent
Maayan et al.

(10) Patent No.: US 6,975,536 B2
(45) Date of Patent: Dec. 13, 2005

(54) MASS STORAGE ARRAY AND METHODS FOR OPERATION THEREOF

(75) Inventors: Eduardo Maayan, Kfar Saba (IL); Ran Dvir, Beit Yehoshua (IL); Zeev Cohen, Safed (IL)

(73) Assignees: Saifun Semiconductors Ltd., Netanya (IL); Infineon Technologies Flash Ltd., Netanya (IL)

( * ) Notice: Subject to any disclaimer, the term of this patent is extended or adjusted under 35 U.S.C. 154(b) by 98 days.

(21) Appl. No.: 10/211,249

(22) Filed: Aug. 5, 2002

(65) Prior Publication Data

US 2003/0142544 A1  Jul. 31, 2003

Related U.S. Application Data

(60) Provisional application No. 60/352,589, filed on Jan. 31, 2002.

(51) Int. Cl.[7] .............................................. G11C 16/04
(52) U.S. Cl. ........................ 365/185.16; 365/185.05; 365/185.24
(58) Field of Search ...................... 365/185.16, 185.05, 365/185.24, 220, 221

(56) References Cited

U.S. PATENT DOCUMENTS

| | | | |
|---|---|---|---|
| 4,281,397 A | 7/1981 | Neal et al. | |
| 4,380,057 A | 4/1983 | Kotecha et al. | |
| 4,388,705 A | 6/1983 | Sheppard | |
| 4,389,705 A | 6/1983 | Sheppard | |
| 4,471,373 A | 9/1984 | Shimizu et al. | |
| 4,527,257 A | 7/1985 | Cricchi | |
| 4,586,163 A | 4/1986 | Koike | |
| 4,667,217 A | 5/1987 | Janning | |
| 4,742,491 A | 5/1988 | Liang et al. | |
| 4,780,424 A | 10/1988 | Holler et al. | |
| 4,847,808 A | 7/1989 | Kobatake | |
| 4,870,470 A | 9/1989 | Bass, Jr. et al. | |
| 4,916,671 A | 4/1990 | Ichiguchi | |
| 4,941,028 A | 7/1990 | Chen et al. | |
| 5,042,009 A | 8/1991 | Kazerounian et al. | |
| 5,075,245 A | 12/1991 | Woo et al. | |
| 5,117,389 A | 5/1992 | Yiu | |
| 5,168,334 A | 12/1992 | Mitchell et al. | |
| 5,175,120 A | 12/1992 | Lee | |
| 5,204,835 A | 4/1993 | Eitan | |
| 5,241,497 A | 8/1993 | Komarek | |
| 5,268,861 A | 12/1993 | Hotta | |
| 5,289,412 A | 2/1994 | Frary et al. | |

(Continued)

FOREIGN PATENT DOCUMENTS

JP   07193151   7/1995

(Continued)

OTHER PUBLICATIONS

Bruno Ricco, "Nonvolatile Multilevel Memories for Digital Appplication", IEEE, vol. 86, No. 12, issued Dec. 1998, pp. 2399-2421.

(Continued)

Primary Examiner—Richard Elms
Assistant Examiner—Hien Nguyen
(74) Attorney, Agent, or Firm—Eitan Law Group

(57) ABSTRACT

Apparatus including a virtual ground array, which includes memory cells connected in rows and columns to word lines and bit lines, respectively. The virtual ground array includes at least one block of data, and peripheral circuitry adapted to simultaneously access a plurality of subsets of the at least one block of data stored in the memory cells along at least one word line. Methods for operating the virtual ground array in a mass storage device include simultaneously accessing a plurality of subsets of at least one block of data stored in the memory cells along at least one word line.

27 Claims, 16 Drawing Sheets

U.S. PATENT DOCUMENTS

| | | |
|---|---|---|
| 5,293,563 A | 3/1994 | Ohta |
| 5,295,108 A | 3/1994 | Higa |
| 5,305,262 A | 4/1994 | Yoneda |
| 5,315,541 A | 5/1994 | Harari et al. |
| 5,345,425 A | 9/1994 | Shikatani |
| 5,349,221 A | 9/1994 | Shimoji |
| 5,359,554 A | 10/1994 | Odake et al. |
| 5,375,094 A | 12/1994 | Naruke |
| 5,399,891 A | 3/1995 | Yiu et al. |
| 5,400,286 A | 3/1995 | Chu et al. |
| 5,412,601 A | 5/1995 | Sawada et al. |
| 5,414,693 A | 5/1995 | Ma et al. |
| 5,418,743 A | 5/1995 | Tomioka et al. |
| 5,422,844 A | 6/1995 | Wolstenholme et al. |
| 5,424,978 A | 6/1995 | Wada et al. |
| 5,426,605 A | 6/1995 | Van Berkel et al. |
| 5,434,825 A | 7/1995 | Harari |
| 5,450,341 A | 9/1995 | Sawada et al. |
| 5,450,354 A | 9/1995 | Sawada et al. |
| 5,467,308 A | 11/1995 | Chang et al. |
| 5,477,499 A | 12/1995 | Van Buskirk et al. |
| 5,495,440 A | 2/1996 | Asakura |
| 5,521,870 A | 5/1996 | Ishikawa |
| 5,537,358 A | 7/1996 | Fong |
| 5,553,018 A | 9/1996 | Wang et al. |
| 5,579,199 A * | 11/1996 | Kawamura et al. ......... 365/108 |
| 5,583,808 A | 12/1996 | Brahmbhatt |
| 5,606,523 A | 2/1997 | Mirabel |
| 5,656,513 A | 8/1997 | Wang et al. |
| 5,661,060 A | 8/1997 | Gill et al. |
| 5,677,869 A | 10/1997 | Fazio et al. |
| 5,683,925 A | 11/1997 | Irani et al. |
| 5,689,459 A | 11/1997 | Chang et al. |
| 5,715,193 A | 2/1998 | Norman |
| 5,717,635 A * | 2/1998 | Akatsu .................. 364/185.05 |
| 5,751,637 A | 5/1998 | Chen et al. |
| 5,754,475 A | 5/1998 | Bill et al. |
| 5,768,193 A | 6/1998 | Lee et al. |
| 5,777,919 A | 7/1998 | Chi-Yung et al. |
| 5,784,314 A | 7/1998 | Sali et al. |
| 5,787,036 A | 7/1998 | Okazawa |
| 5,793,079 A | 8/1998 | Georgescu et al. |
| 5,812,449 A | 9/1998 | Song |
| 5,812,456 A | 9/1998 | Hull et al. |
| 5,812,457 A | 9/1998 | Arase |
| 5,828,601 A | 10/1998 | Hollmer et al. |
| 5,835,935 A * | 11/1998 | Estakhri et al. ............. 711/103 |
| 5,841,700 A | 11/1998 | Chang |
| 5,847,441 A | 12/1998 | Cutter et al. |
| 5,862,076 A | 1/1999 | Eitan |
| 5,867,429 A * | 2/1999 | Chen et al. ............ 365/185.33 |
| 5,886,927 A | 3/1999 | Takeuchi |
| 5,892,710 A | 4/1999 | Fazio et al. |
| 5,926,409 A | 7/1999 | Engh et al. |
| 5,946,258 A | 8/1999 | Evertt et al. |
| 5,949,714 A | 9/1999 | Hemink et al. |
| 5,949,728 A | 9/1999 | Liu et al. |
| 5,963,465 A | 10/1999 | Eitan |
| 5,966,603 A | 10/1999 | Eitan |
| 5,969,993 A | 10/1999 | Takeshima |
| 5,990,526 A | 11/1999 | Bez et al. |
| 5,991,202 A | 11/1999 | Derhacobian et al. |
| 6,011,725 A | 1/2000 | Eitan |
| 6,034,896 A | 3/2000 | Ranaweera et al. |
| 6,064,591 A | 5/2000 | Takeuchi et al. |
| 6,075,724 A | 6/2000 | Li et al. |
| 6,081,456 A | 6/2000 | Dadashev |
| 6,097,639 A | 8/2000 | Choi et al. |
| 6,118,692 A | 9/2000 | Banks |
| 6,128,226 A | 10/2000 | Eitan et al. |
| 6,134,156 A | 10/2000 | Eitan |
| 6,147,904 A | 11/2000 | Liron |
| 6,157,570 A | 12/2000 | Nachumovsky |
| 6,163,048 A | 12/2000 | Hirose et al. |
| 6,169,691 B1 | 1/2001 | Pasotti et al. |
| 6,175,523 B1 | 1/2001 | Yang et al. |
| 6,181,605 B1 | 1/2001 | Hollmer et al. |
| 6,205,056 B1 | 3/2001 | Pan et al. |
| 6,215,148 B1 | 4/2001 | Eitan |
| 6,215,702 B1 | 4/2001 | Derhacobian et al. |
| 6,218,695 B1 | 4/2001 | Nachumovsky |
| 6,222,762 B1 * | 4/2001 | Guterman et al. ...... 365/185.03 |
| 6,222,768 B1 | 4/2001 | Hollmer et al. |
| 6,240,032 B1 | 5/2001 | Fukumoto |
| 6,240,040 B1 | 5/2001 | Akaogi et al. |
| 6,256,231 B1 | 7/2001 | Lavi et al. |
| 6,266,281 B1 | 7/2001 | Derhacobian et al. |
| 6,282,145 B1 | 8/2001 | Tran et al. |
| 6,285,574 B1 | 9/2001 | Eitan |
| 6,292,394 B1 | 9/2001 | Cohen et al. |
| 6,304,485 B1 | 10/2001 | Harari et al. |
| 6,307,807 B1 | 10/2001 | Sakui et al. |
| 6,330,192 B1 | 12/2001 | Ohba et al. |
| 6,331,950 B1 | 12/2001 | Kuo et al. |
| 6,343,033 B1 | 1/2002 | Parker |
| 6,346,442 B1 | 2/2002 | Aloni et al. |
| 6,396,741 B1 | 5/2002 | Bloom et al. |
| 6,426,898 B1 | 7/2002 | Mihnea et al. |
| 6,490,204 B2 | 12/2002 | Bloom et al. |
| 6,522,585 B2 * | 2/2003 | Pasternak .............. 365/185.21 |
| 6,552,387 B1 | 4/2003 | Eitan |
| 6,570,211 B1 * | 5/2003 | He et al. .................... 257/314 |
| 2002/0132436 A1 | 9/2002 | Ellyahu et al. |
| 2002/0191465 A1 | 12/2002 | Maayan et al. |
| 2003/0076710 A1 | 4/2003 | Sofer et al. |
| 2003/0156456 A1 | 8/2003 | Shappir et al. |

FOREIGN PATENT DOCUMENTS

| | | |
|---|---|---|
| JP | 09162314 | 6/1997 |
| WO | WO 99/31670 | 6/1999 |

OTHER PUBLICATIONS

Chang, J., "*Non Vollatile Semiconductor Memory Devices,*" Proceeding of the IEEE, vol. 64 No. 7, Issued Jul. 1976.

Bude et al., "*EEPROM/Flash Sub 3.0V Drain—Source Bias Hot Carrier Writing*", IEDM 95, pp. 989-992.

Bude et al., "*Modeling Nonequilibrium Hot Carrier Device Effects*", Conferences of Insulator Specialists of Europe, Sweden, Jun., 1997.

\* cited by examiner

MASS STORAGE ARRAY AND METHODS FOR OPERATION THEREOF

CROSS-REFERENCE TO RELATED APPLICATIONS

The present application claims priority from U.S. provisional patent application Ser. No. 60/352,589, filed Jan. 31, 2002, which is hereby incorporated by reference in its entirety.

FIELD OF THE INVENTION

The present invention relates generally to mass storage devices, and particularly to mass storage devices that include non-volatile memory cell arrays and methods for operation thereof.

BACKGROUND OF THE INVENTION

Mass storage non-volatile memory (NVM) devices enable read and/or write access to data containing many bytes. Mass storage devices are typically, but not only, used in applications such as hard disks, or digital video storage devices, such as for digital cameras. Throughout the specification and claims, the term "mass storage device" refers not only to memory devices that are capable of the storage functionality of hard disks or video storage devices and the like, but also to memory devices capable of storing and providing access to at least 512 megabyte (MB) of data or to memory devices requiring very fast programming and read access rates. The amount of data accessible with the mass storage device may include "blocks" of data. A "block" is defined as a basic amount of data containing a certain amount of bytes. For example, a block may contain 256 bytes (256B), 512B, 528B or any other number of bytes.

In mass storage NVM devices, read and program operations may be performed in a block granularity, i.e., on a single block. Erase operations may be performed on a single block or groups of blocks. Such groups of blocks are defined as "erase sectors" (E-sectors). For example, an E-sector may contain 8 blocks, 32 blocks or 64 blocks or any other number of blocks.

Mass storage NVM devices generally require extremely fast programming rates and fast burst read access. As a relative example, mass storage devices require programming rates at least 2–10 times faster than currently standard code flash devices. In read operations, first byte latency of a few microseconds may be acceptable, but fast burst read capability in the range of tens of nanoseconds is generally required.

In addition to the program, erase and read requirements mentioned above, mass storage NVM devices may require a very dense array architecture due to the large amount of data stored in a single chip. In currently standard floating gate technology, both NAND and NOR array architectures are used for mass storage applications. The NAND architecture is generally denser than NOR, while NOR is generally more reliable and robust than NAND.

SUMMARY OF THE INVENTION

The present invention seeks to provide an improved mass storage device, which may enable fast read, program and erase operations at different granulations. In the present invention, the mass storage device may comprise a virtual ground array of memory cells connected in rows and columns to word lines and bit lines, respectively. The invention may employ NVM cells that include a non-conducting charge trapping layer, such as nitride, read only memory (NROM) cells.

In a non-volatile memory array, memory cells may be arranged in columns and rows. In a virtual ground array architecture, the memory cells along a given column are connected between two bit lines. A first bit line connects one of the column's cell's source or drain terminals, and a second bit line connects all the column's cells' other drain or source terminals. The first bit line may be shared with an adjacent column and serve as the second bit line of that adjacent column. Likewise, the second bit line may be shared with another adjacent column and serve as the first bit line of that adjacent column. In a virtual ground array, the memory cells along a given row have their gate terminals connected together to the same node usually called the "word line". The virtual ground array is usually segmented along bit lines such that the segmented bit lines become local bit lines (local to the segment), and the local bit lines along a column of the whole array are usually connected through select transistors to a global bit line.

In the present invention, a whole block may be "place", that is, stored in bits, along a single word line. The block may be partitioned into multiple virtual ground isolated slices. Alternatively, one word line may include multiple blocks or may be partitioned into isolated slices. All the isolated slices corresponding to a block may be accessed in parallel, for example. Each bit in an isolated slice may be accessed through global bit lines. Bits in an isolated slice may be sequentially accessed until the whole block is accessed.

Operating (e.g., reading, programming or erasing) on the virtual ground array, mass storage device, may comprise performing consecutive accesses to subsets of the bits on single or multiple blocks along single or multiple word lines. The subsets of the bits of the blocks may be accessed in parallel or serially, for example. Consecutive accesses are performed until a portion or all of the bits are operated upon. The subsets may be of equal or unequal size.

There is thus provided in accordance with a preferred embodiment of the present invention a method for operating (at least one of reading, programming and erasing) a mass storage device, the method including operating on a virtual ground array, mass storage non-volatile memory device, which includes memory cells connected in rows and columns to word lines and bit lines, respectively.

In accordance with a preferred embodiment of the present invention the virtual ground array includes at least one block of data stored in bits along at least one word line, and the operating includes performing consecutive accesses to subsets of the bits of the at least one block along the at least one word line.

Further in accordance with a preferred embodiment of the present invention the operating includes parallel accessing of a subset of the bits of the at least one block, wherein the subset includes at least one bit of the at least one block.

Still further in accordance with a preferred embodiment of the present invention the operating includes serial accessing of a subset of the bits of the at least one block, wherein the subset includes at least one bit of the at least one block.

In accordance with a preferred embodiment of the present invention the method further includes performing consecutive accesses to the subsets until a portion or all of the bits of the at least one block are operated upon.

Further in accordance with a preferred embodiment of the present invention the virtual ground array includes at least one block of data stored in bits along at least one word line, and the operating includes accessing equal-sized or unequal-sized subsets of bits.

Still in accordance with a preferred embodiment of the present invention the virtual ground array includes at least one block of data stored in bits in virtual ground isolated slices along at least one word line, and the operating includes accessing subsets of bits that are located at the same location in at least two of the virtual ground isolated slices.

In accordance with a preferred embodiment of the present invention the virtual ground array includes at least one block of data stored in bits along at least one word line, and the operating includes reading the data from one of the subsets and storing the data in a memory location while accessing another one of the subsets.

Further in accordance with a preferred embodiment of the present invention the virtual ground array includes at least one block of data stored in bits along at least one word line, and the operating includes driving the at least one word line to an operating voltage level once per a block operation.

There is also provided in accordance with a preferred embodiment of the present invention apparatus including a virtual ground array, mass storage non-volatile memory device, including memory cells connected in rows and columns to word lines and bit lines, respectively.

In accordance with a preferred embodiment of the present invention the virtual ground array device includes at least one block of data stored in bits along a single word line.

Further in accordance with a preferred embodiment of the present invention the virtual ground array device includes at least one block of data stored in bits along more than one word line.

Still further in accordance with a preferred embodiment of the present invention the virtual ground array device includes a block of data partitioned into isolated slices.

The isolated slices may be arranged continuously on a word line. In another embodiment, the isolated slices may be arranged in separate segments on a word line.

In accordance with a preferred embodiment of the present invention row decoding circuitry is provided and at least one word line driver is adapted to provide access and drive voltages to the word lines. The isolated slices may be accessible in parallel.

Further in accordance with a preferred embodiment of the present invention the isolated slices are segmented along the bit lines by select transistors into isolated physical sectors (P-sectors).

Still further in accordance with a preferred embodiment of the present invention a bit line in at least one of the P-sectors includes a local bit line (LBL) connected through a select transistor to a global bit line (GBL).

In accordance with a preferred embodiment of the present invention different LBLs corresponding to different P-sectors share a common GBL.

Further in accordance with a preferred embodiment of the present invention different LBLs within a P-sector share a common GBL.

Still further in accordance with a preferred embodiment of the present invention at least one bit in at least one of the isolated slices is accessible through a global bit line.

Additionally in accordance with a preferred embodiment of the present invention at least one of the memory cells includes a non-conducting charge trapping layer.

In accordance with a preferred embodiment of the present invention at least one of the memory cells is a nitride, read only memory (NROM) cell.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Figure 1:
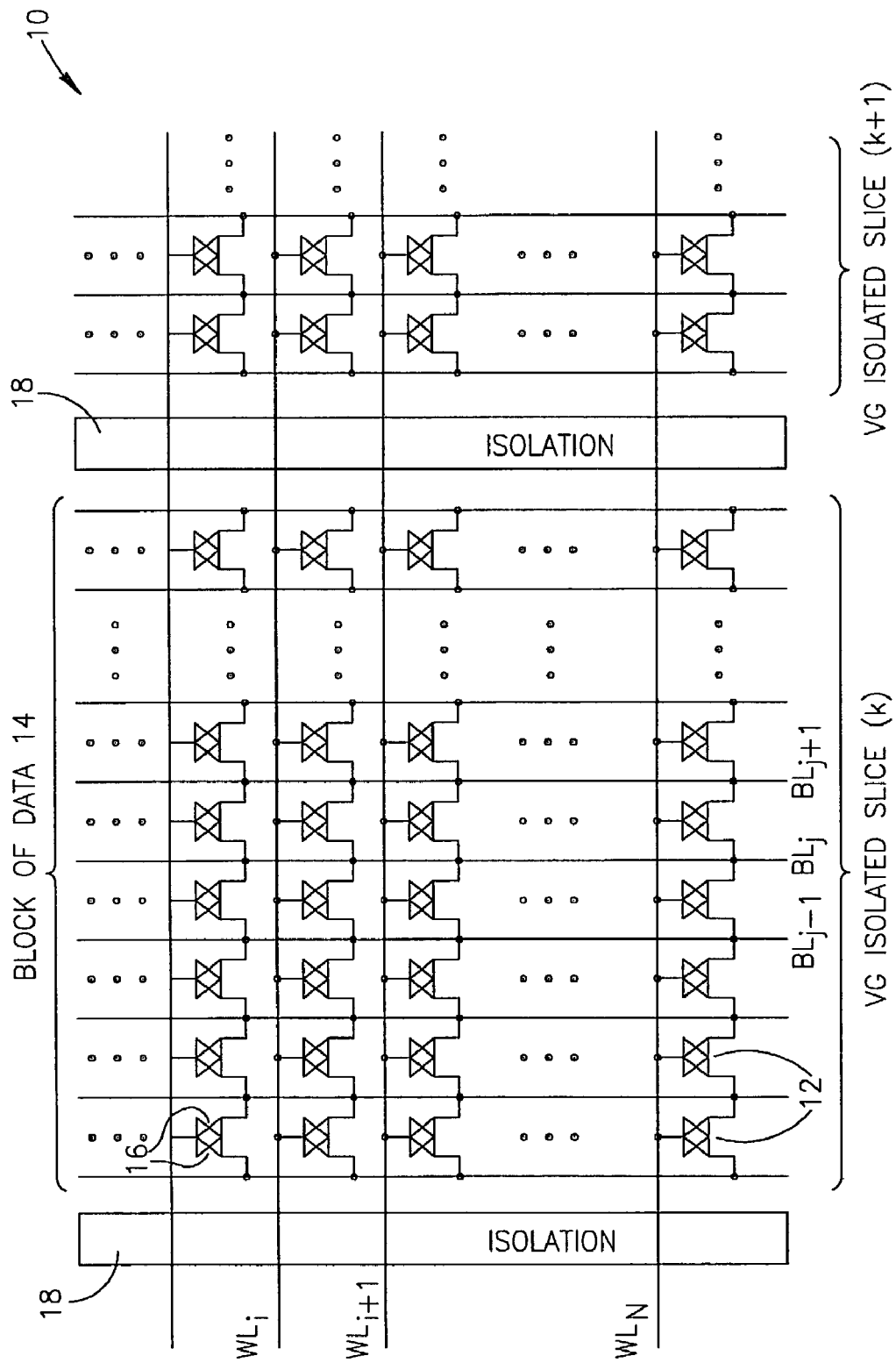
FIG. 1 is a simplified illustration of a virtual ground array, mass storage non-volatile memory device, constructed and operative in accordance with a preferred embodiment of the present invention.

Reference is now made to FIG. 1, which illustrates a virtual ground array, mass storage non-volatile memory device 10, constructed and operative in accordance with a preferred embodiment of the present invention.

The virtual ground array device 10 preferably comprises memory cells 12 connected in rows and columns to word lines (designated in FIG. 1 as WLi, WLi+1, and so forth) and bit lines (designated in FIG. 1 as BLj, BLj+1, and so forth), respectively. One or more blocks 14 of data may be stored in bits 16 along a single word line WLi. (It is noted that memory cells 12 are shown as storing two bits per cell. However, it is appreciated that cells 12 may store a single bit or any other number of bits.) One or more blocks 14 of data may be partitioned into isolated virtual ground array slices (designated in FIG. 1 as VG isolated slice k, k+1 and so forth), wherein the slice is bounded by isolation zone 18. The isolation zones 18 may be positioned so as to isolate a single column of memory cells or a plurality of columns.

The slices may share the same word lines.

Figure 2A:
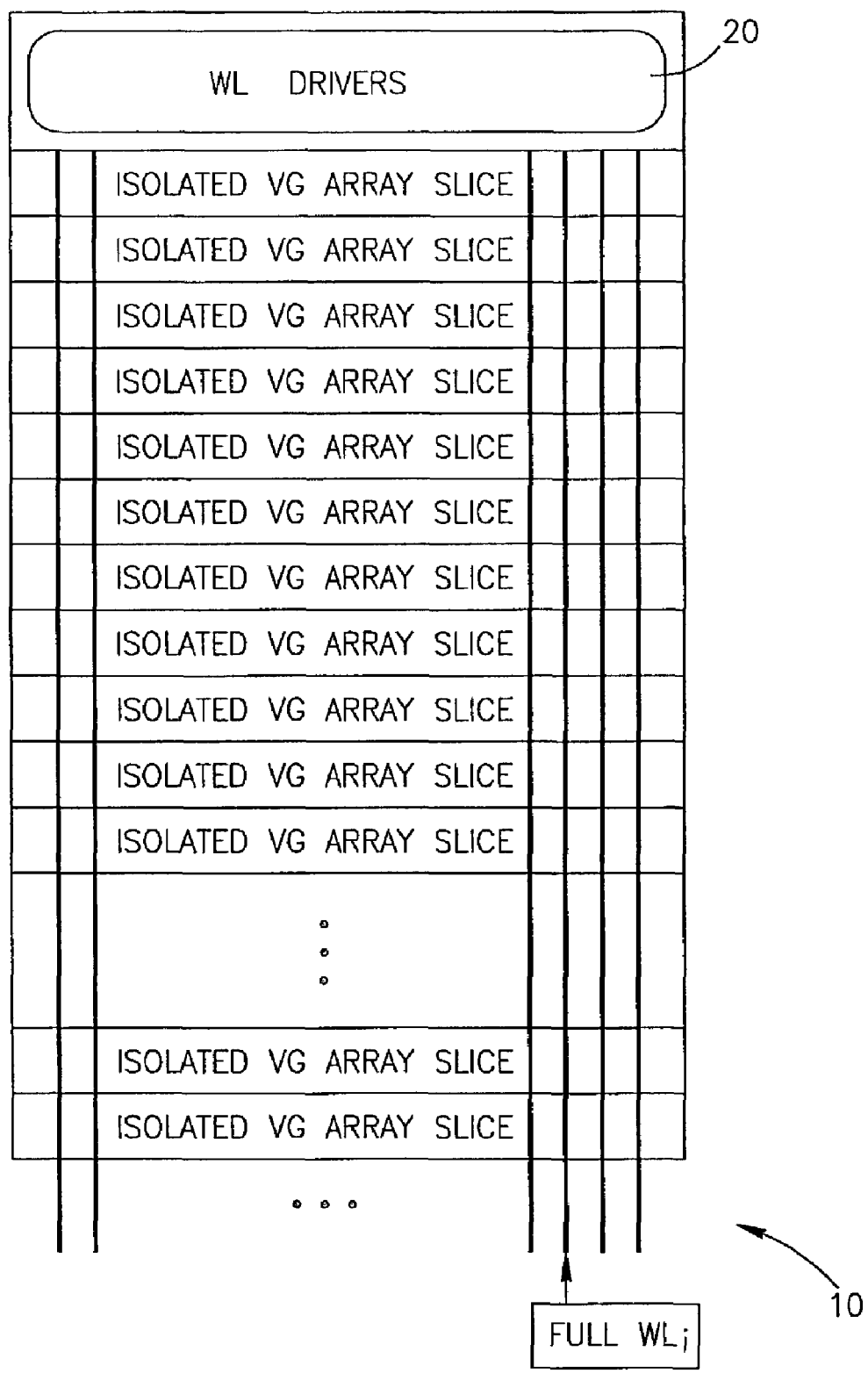
FIGS. 2A and 2B are simplified illustrations of two examples of virtual ground arrays constructed in accordance with different embodiments of the invention, wherein word lines are respectively continuous and segmented.
Figure 2B:
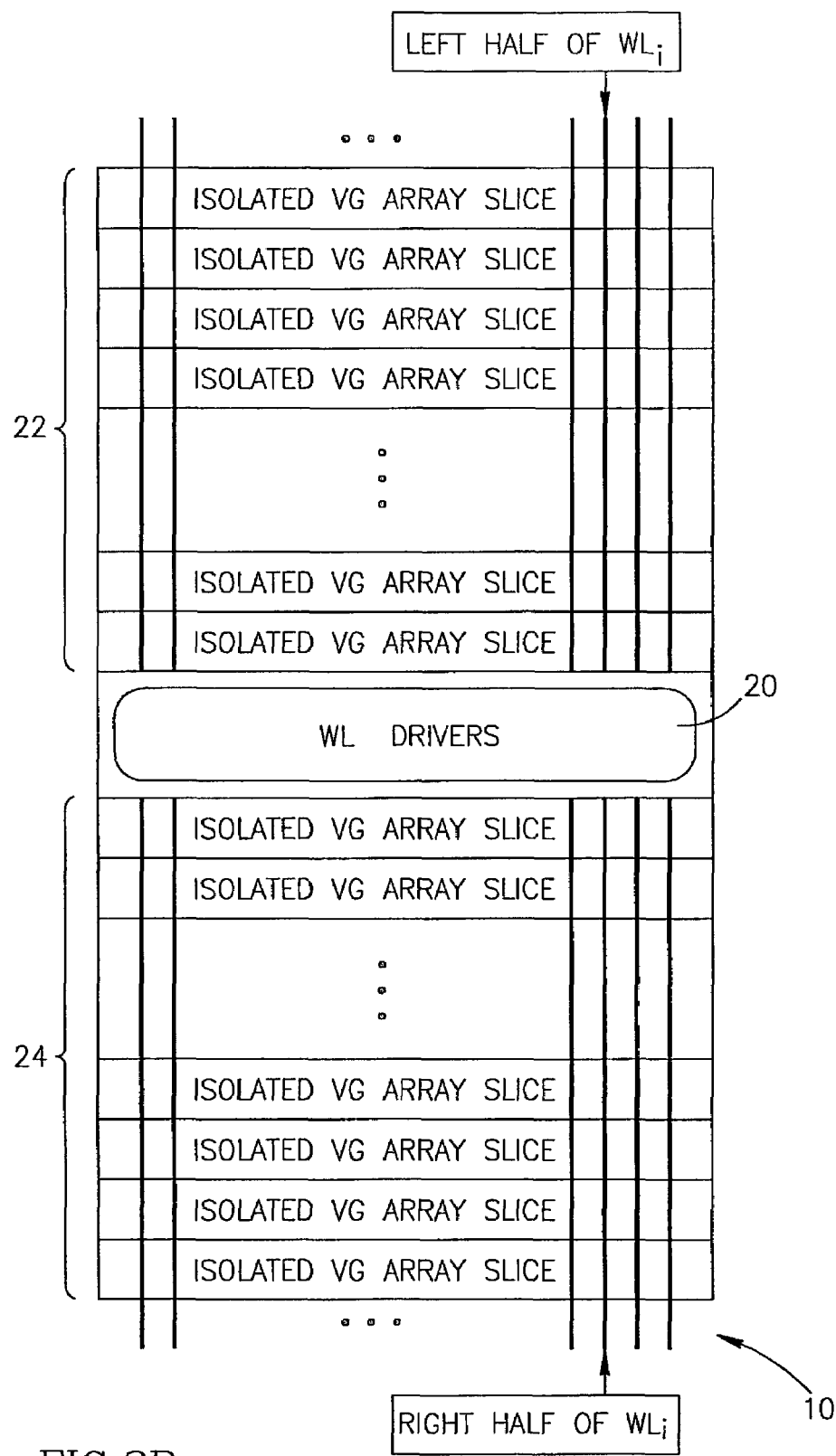

Reference is now made to FIGS. 2A and 2B, which illustrate two examples of virtual ground arrays constructed in accordance with different embodiments of the invention. In FIG. 2A, the word lines WLi are continuous, meaning that the virtual ground slices are continuously arranged along the word lines. One or more word line drivers 20 may be placed at one end of the array to drive voltages to all the slices along the word lines.

In FIG. 2B, the word lines WLi are segmented, meaning that the virtual ground slices are not continuously arranged along the word lines, but rather are "broken up" into segments, which may be separately driven by word line drivers 20 positioned between individual segments. For example, in the illustrated embodiment in FIG. 2B, one segment 22 is positioned at the left half of the word lines WLi, and another segment 24 is positioned at the right half of the word lines WLi.

Figure 3:
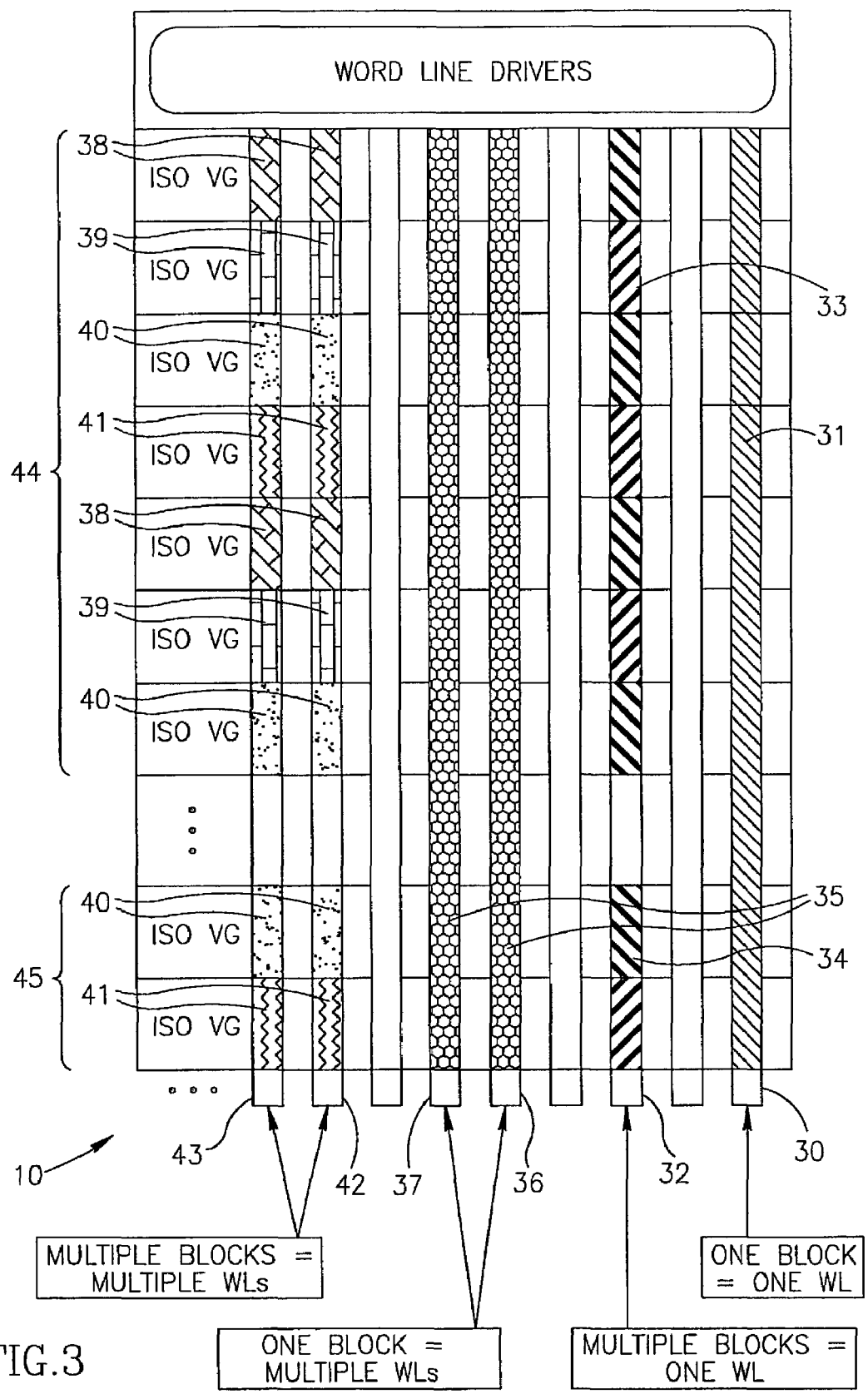
FIG. 3 is a simplified illustration of further examples of virtual ground arrays constructed in accordance with different embodiments of the invention.

Reference is now made to FIG. 3, which illustrates further examples of virtual ground arrays constructed in accordance with different embodiments of the invention. In FIG. 3, a whole block (for example, block (i) 31) may be "placed", that is, stored in bits, along a single word line 30. In other words, the entire, single word line 30 comprises the block (i).

Alternatively, one word line 32 may include multiple blocks (for example, block (j) and block (k)) and/or may be partitioned into isolated slices 33 and 34, for example. As another alternative, one block (for example, block (l) 35) may be placed on multiple word lines 36 and 37.

As yet another alternative, multiple blocks (for example, block (m) 38, block (n) 39, block (o) 40 and block (p) 41) may be distributed among different word lines 42 and 43, and/or may be partitioned into isolated slices 44 and 45, for example. In all of the above embodiments, all of the bits along a word line within an isolated slice belong to just one block. The isolated slices are preferably accessible in parallel.

Figure 4:
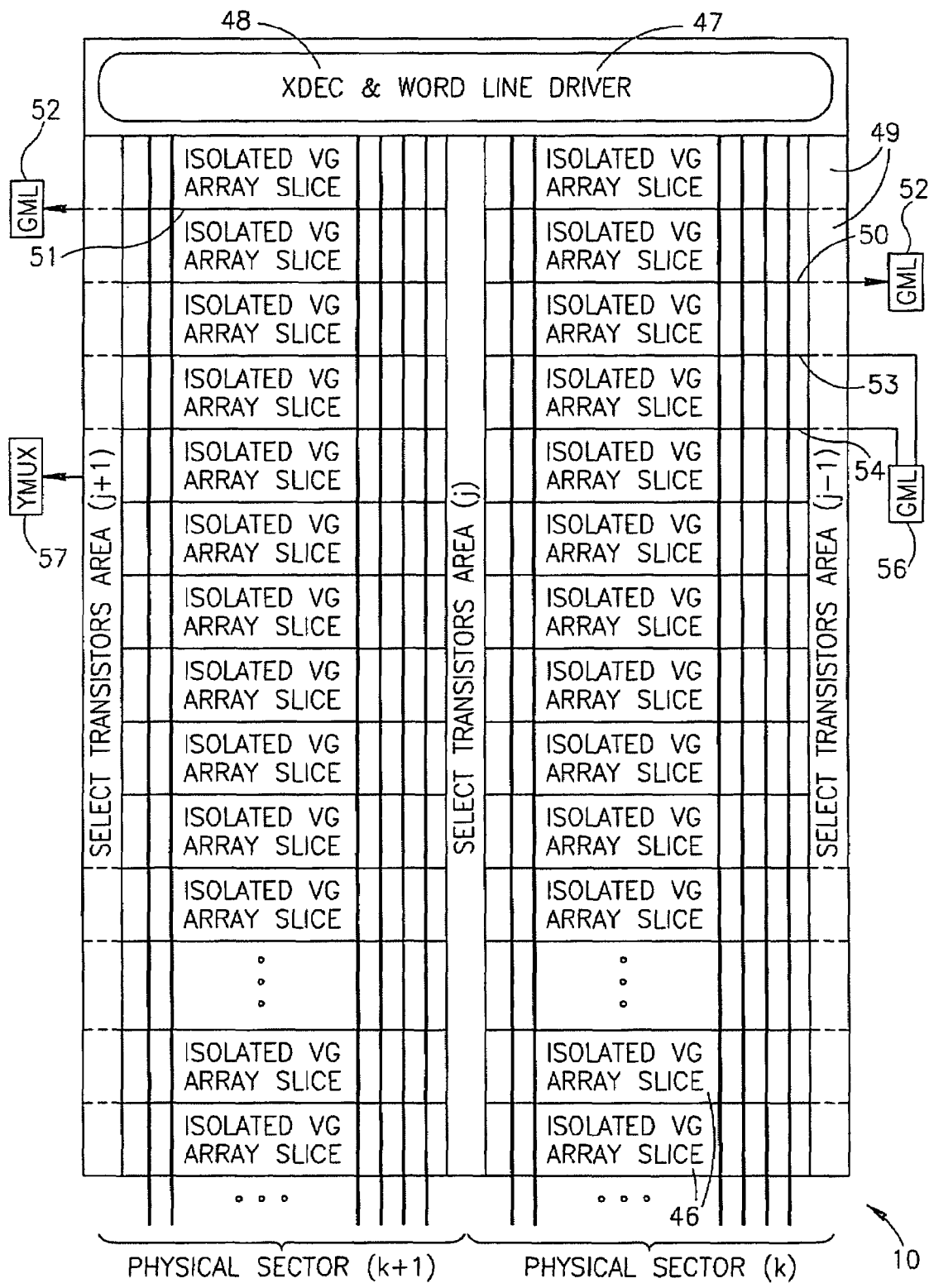
FIG. 4 is a simplified illustration of an example of segmentation of the virtual ground array in accordance with an embodiment of the invention.

Reference is now made to FIG. 4, which illustrates an example of segmentation of the virtual ground array in accordance with an embodiment of the invention. In the embodiment of FIG. 4, there is a continuous arrangement of isolated virtual ground array slices 46 along the word lines WLi, as in the embodiment of FIG. 2A, but it is appreciated that the segmentation of FIG. 4 may also be applied to other arrangements, such as, but not limited to, multiple blocks distributed among different word lines, for example. A word line driver 47 may be placed at one end of the array to drive voltages to all the slices along the word lines, and standard row decoding circuitry (XDEC) 48 may provide access to the word lines.

The isolated slices 46 may be segmented in the bit line direction by select transistors 49. The select transistors 49 may be arranged in distinct areas in the virtual ground array device, such as select transistor areas j−1, j and j+1, as seen in FIG. 4. The segmentation creates isolated physical sectors (P-sectors), such as physical sector k and physical sector k+1. Each bit line in a P-sector is a local bit line (LBL) and is preferably connected through a select transistor 49 to a global bit line (GBL). Different LBLs corresponding to different P-sectors may share a single GBL. For example, a local bit line 50 in P-sector k and a local bit line 51 in P-sector k+1 may share a common GBL 52. Multiple LBLs within a P-sector may share the same GBL. For example, local bit lines 53 and 54 in P-sector k may share a GBL 56.

The virtual ground array device may employ NVM cells that include a non-conducting charge trapping layer, such as nitride, read only memory (NROM) cells. NROM cells may have multiple storage areas, wherein one bit of a block corresponds to one of the storage areas of the NROM cell. In order to read, program or erase the bit, access to the gate, source and drain terminals of the NROM cell is required.

The gate terminal is the WL on which the NROM cell is located. The word line driver 47 and XDEC 48 drive the accessed WL to a first voltage level, which depends on the operation (read, program or erase) to be performed. Furthermore, the word line driver 47 and XDEC 48 drive all the non-accessed word lines, which are in the same P-sector as the accessed word line, to a second voltage level. The second voltage level also depends on the operation to be performed.

The local bit lines of the NROM cell act as the source and drain terminals of the cell. The source and drain terminals may be accessed through a multiplexing circuit (YMUX) 57, via global bit lines, select transistors 49 and the local bit lines. Appropriate configurations of the YMUX 57 and the select transistors 49 drive the source and drain terminals of the cells to third and fourth voltage levels, which depend on the operation to be performed.

Examples of different kinds of operations are described hereinbelow. General examples are described with reference to FIGS. 5A–5H. More specific examples of read operations are described with reference to FIGS. 6A–6C. More specific examples of program operations are described with reference to FIGS. 7A and 7B. More specific examples of erase operations are described with reference to FIGS. 8A and 8B.

Figures 5A, 5B:
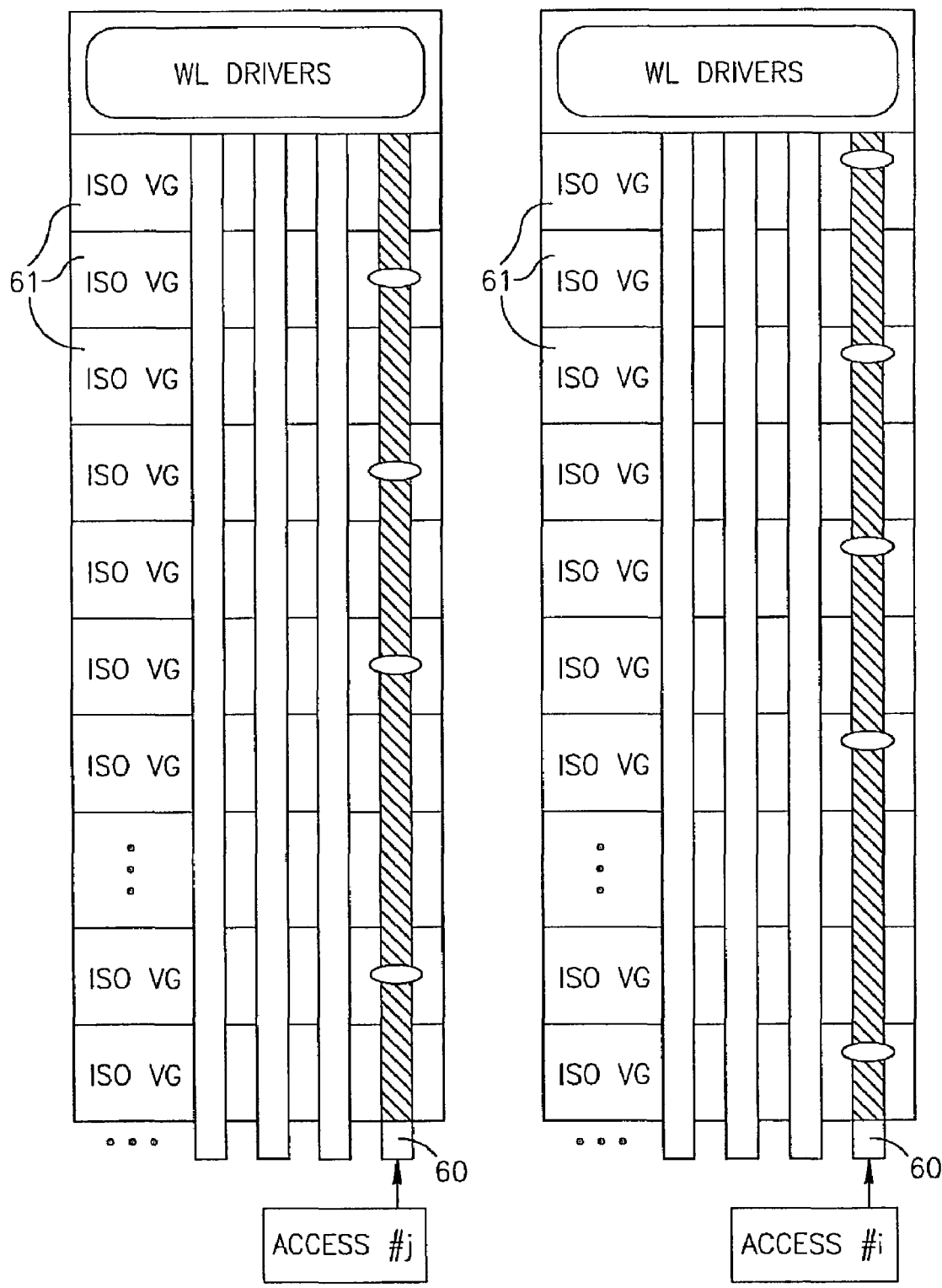
FIGS. 5A and 5B are simplified illustrations of operating on bits in a block, in accordance with an embodiment of the invention, wherein all of the bits of the entire block are along a single word line in isolated virtual ground array slices.

Reference is now made to FIGS. 5A and 5B, which illustrate an example of operating on bits in a block, in accordance with an embodiment of the invention. In FIGS. 5A and 5B, as in block 31 of FIG. 3 hereinabove, all of the bits of the entire block are along a single word line 60 in isolated virtual ground array slices 61. The operation may comprise consecutive accesses to subsets of the block's bits along the word line 60. Each of the consecutive operations may comprise parallel or serial (or any other type of) accessing of a subset of the block's bits. The subset preferably contains at least one bit of that block.

In the illustrated example, each of the bits in the subset is placed in a different isolated VG array slice 61. In FIG. 5A, a first operation is performed on a first subset that comprises bits in cells situated towards the left side of odd numbered isolated slices 61. In FIG. 5B, a second operation is performed on a second subset that comprises bits in cells situated towards the middle of even numbered isolated slices 61. Consecutive accesses to subsets of the block's bits preferably continue until all the block's bits are operated upon.

Figures 5C, 5D:
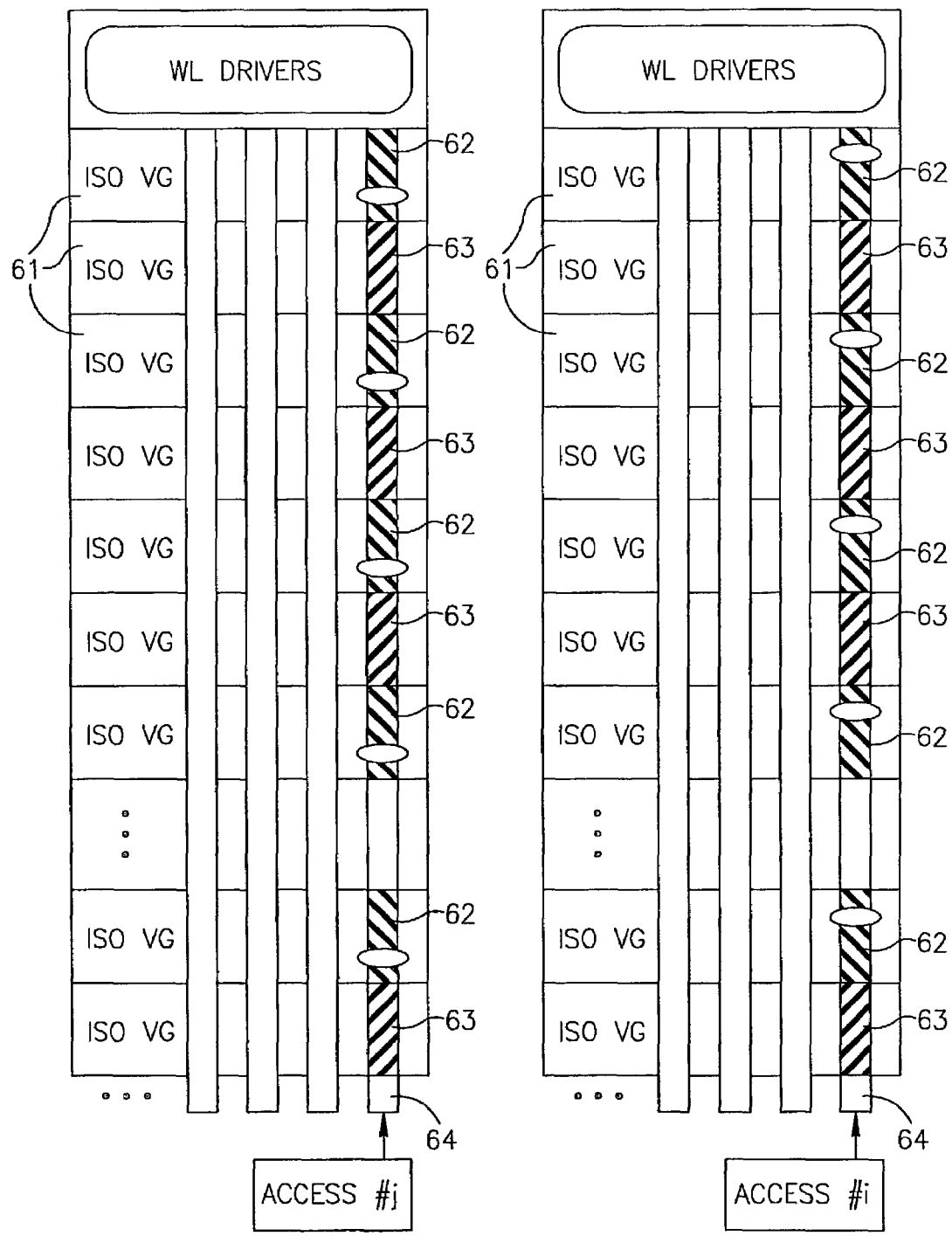
FIGS. 5C and 5D are simplified illustrations of operating on bits in a block, in accordance with another embodiment of the invention, wherein multiple blocks are placed along a single word line.

Reference is now made to FIGS. 5C and 5D, which illustrate an example of operating on bits in a block, in accordance with another embodiment of the invention. In FIGS. 5C and 5D, as in the case of block (j) and block (k) placed on word line 32 in FIG. 3 hereinabove, a plurality of blocks, such as blocks 62 and 63, are placed along a single word line 64. The operation may comprise consecutive accesses to subsets of a particular block's bits along the word line 64. As mentioned hereinabove, each of the consecutive operations may comprise parallel or serial (or any other type of) accessing of a subset of the block's bits.

In FIG. 5C, a first operation is performed on a first subset of block 62 that comprises bits in cells situated towards the left side of the isolated slices 61. In FIG. 5D, a second operation is performed on a second subset of block 62 that comprises bits in cells situated towards the right of the isolated slices 61. As mentioned before, consecutive accesses to subsets of the block's bits preferably continue until all the block's bits are operated upon.

Figure 5F:
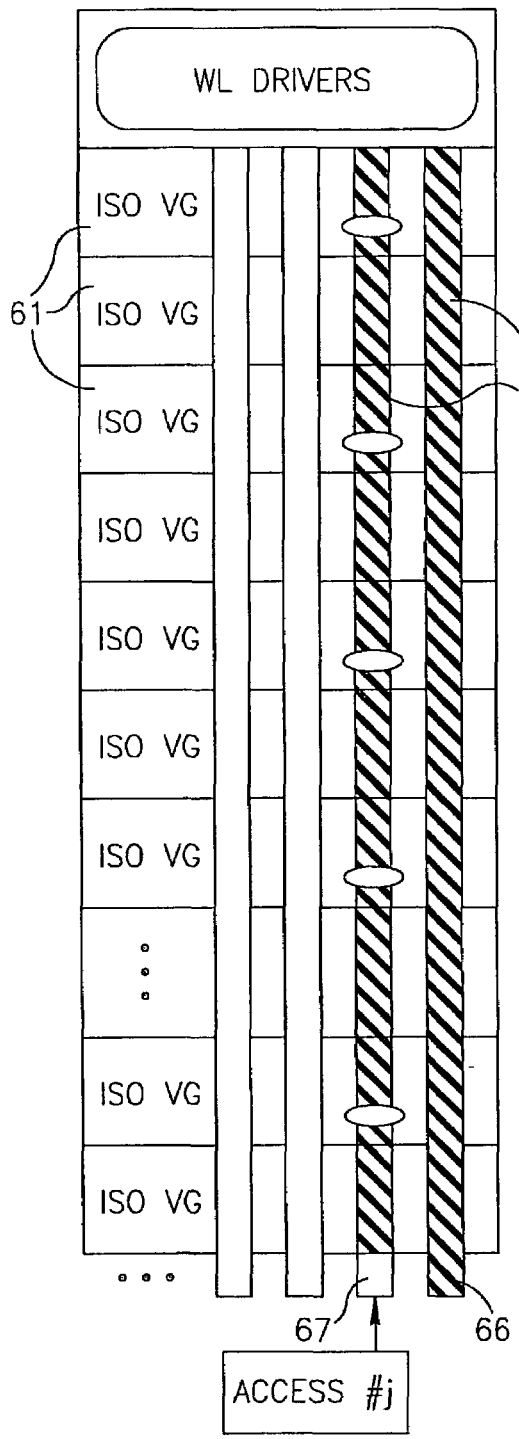
FIGS. 5E and 5F are simplified illustrations of operating on bits in a block, in accordance with yet another embodiment of the invention, wherein a block is placed along a plurality of word lines.
Figure 5E:
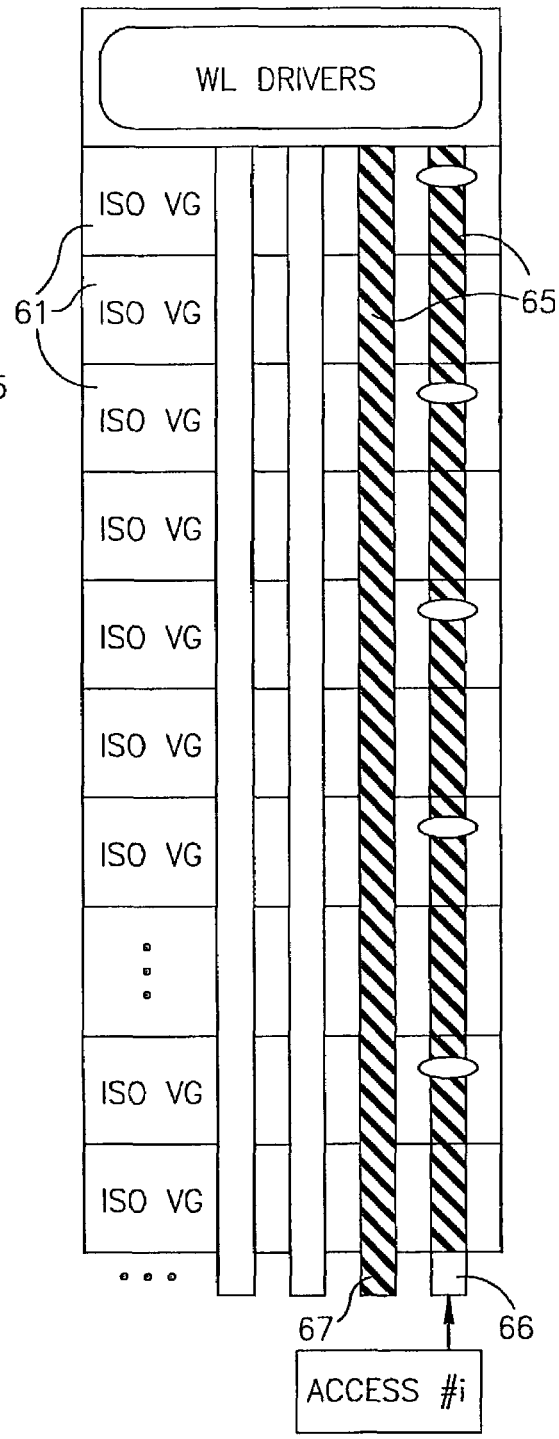

Reference is now made to FIGS. 5E and 5F, which illustrate an example of operating on bits in a block, in accordance with yet another embodiment of the invention. In FIGS. 5E and 5F, as in the case of block 35 placed on a plurality of word lines 36 and 37 in FIG. 3 hereinabove, a block 65 is placed along a plurality of word lines 66 and 67. In FIG. 5E, a first operation is performed on a first subset of block 65 that comprises bits in cells situated towards the left side of the isolated slices 61 on word line 66. In FIG. 5F, a second operation is performed on a second subset of block 65 that comprises bits in cells situated towards the right of the isolated slices 61 on word line 67. It is noted that consecutive operations may be performed on the same word line or on different word lines. As mentioned before, consecutive accesses to subsets of the block's bits on the word lines preferably continue until all the block's bits are operated upon.

Figures 5G, 5H:
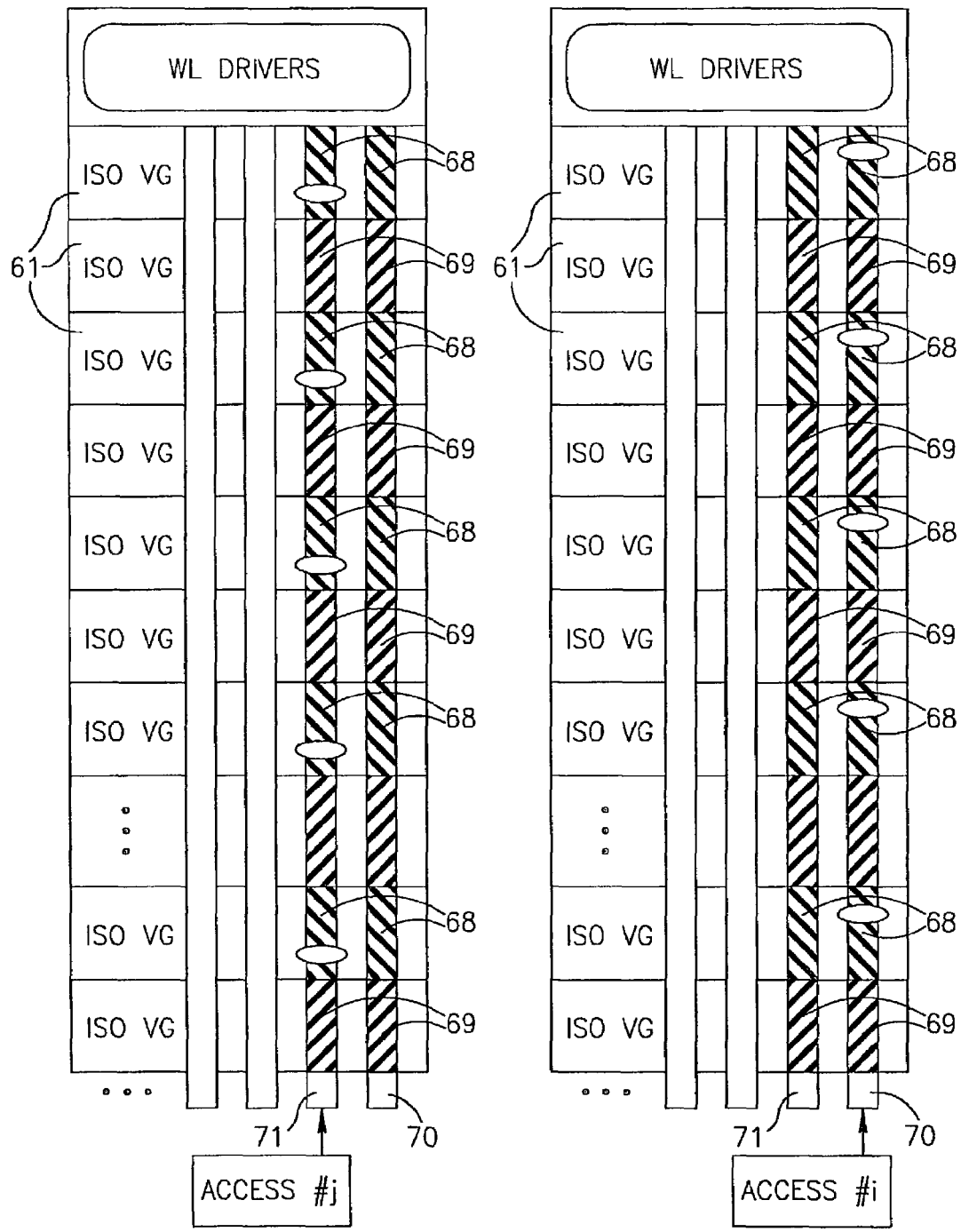
FIGS. 5G and 5H are simplified illustrations of operating on bits in a block, in accordance with still another embodiment of the invention, wherein a plurality of blocks are placed along a plurality of word lines.

Reference is now made to FIGS. 5G and 5H, which illustrate an example of operating on bits in a block, in accordance with still another embodiment of the invention. In FIGS. 5G and 5H, as in the case of a plurality of blocks 38–41 distributed among different word lines 42 and 43 in FIG. 3 hereinabove, a plurality of blocks 68 and 69 are placed along a plurality of word lines 70 and 71. In FIG. 5G, a first operation is performed on a first subset of block 68 that comprises bits in cells situated towards the left side of the isolated slices 61 on word line 70. In FIG. 5H, a second operation is performed on a second subset of block 68 that comprises bits in cells situated towards the right of the isolated slices 61 on word line 71. It is noted that consecutive operations may be performed on the same word line or on different word lines. As mentioned before, consecutive accesses to subsets of the block's bits on the word lines preferably continue until all the block's bits are operated upon.

In a virtual ground array, such as the one described hereinabove, accessing a word line usually takes a long time, mainly due to the RC delay of the word line. Therefore, in one embodiment of the present invention, a single block or multiple blocks may be placed on a single word line. In such case, the word line is driven once and then all the bits of the block may be accessed serially and/or in parallel until all the block's bits are operated upon.

Figure 6A:
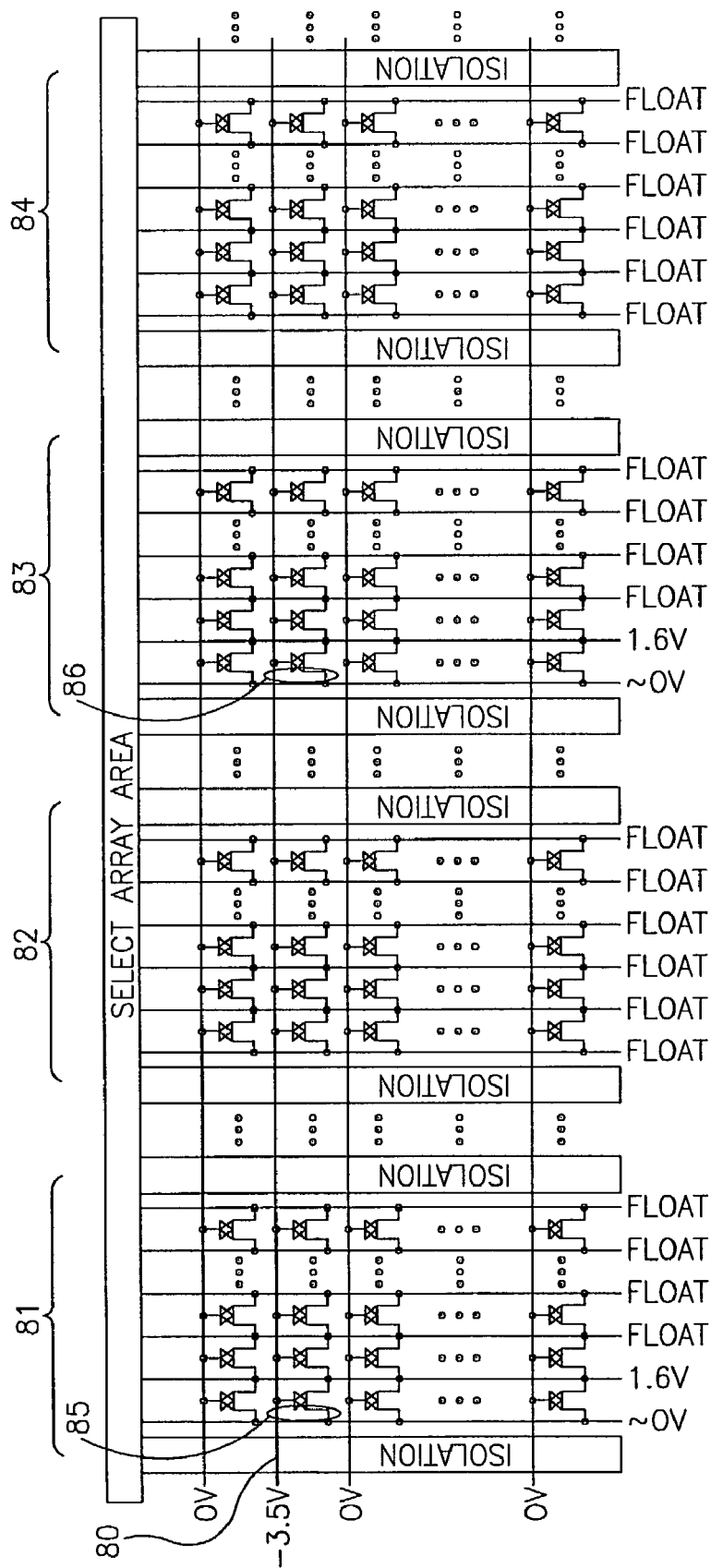
FIGS. 6A–6C are simplified illustrations of reading bits in a block, in accordance with an embodiment of the invention.
Figure 6B:
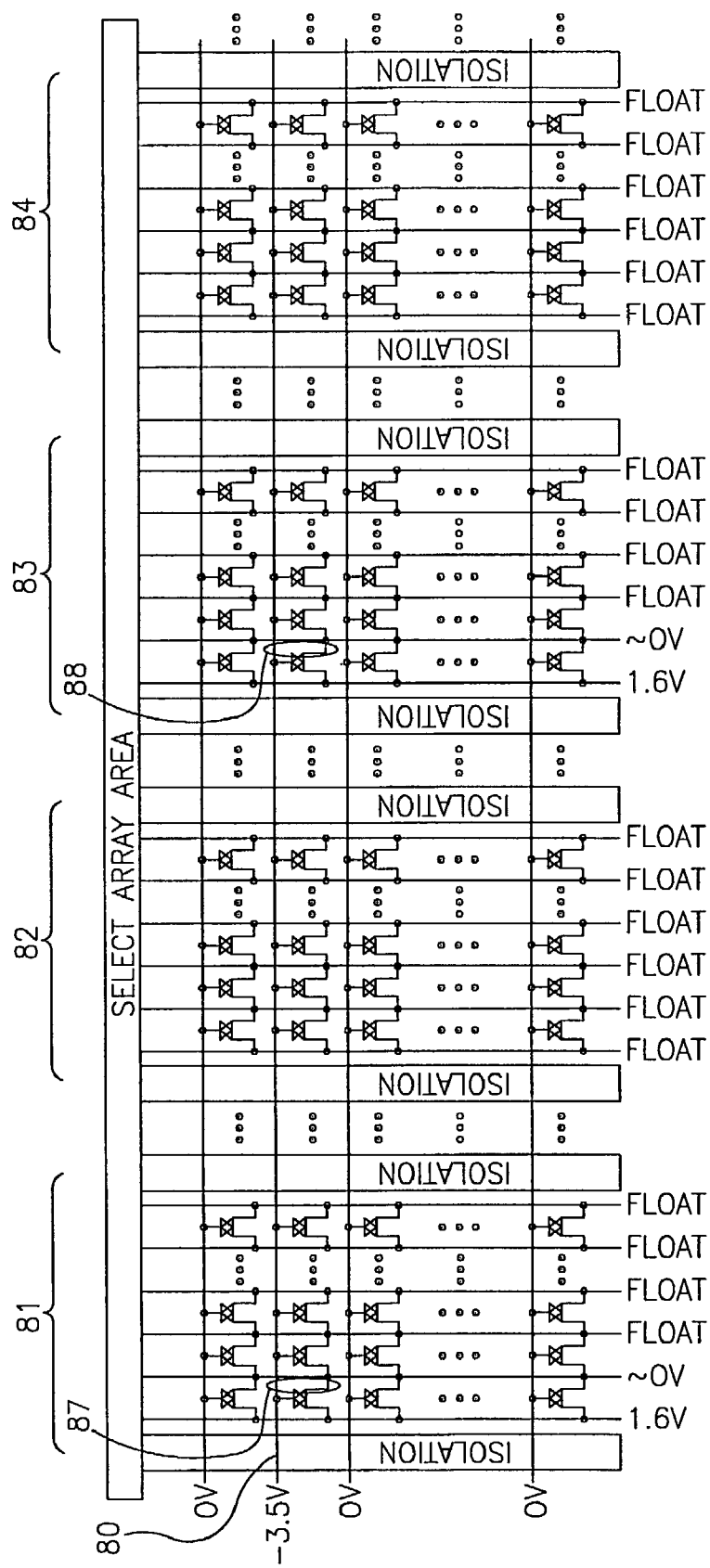
Figure 6C:
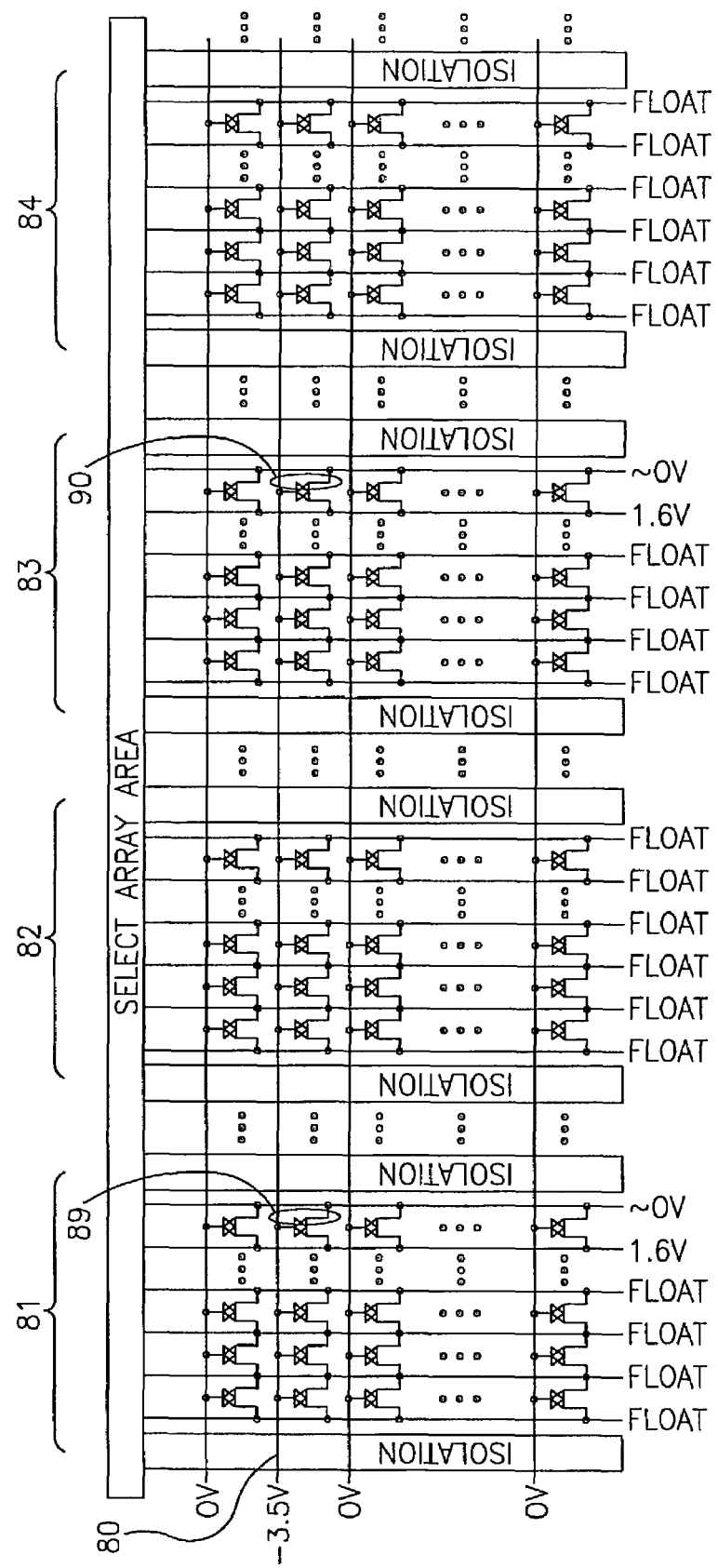

Reference is now made to FIGS. 6A–6C, which illustrate an example of reading bits in a block, in accordance with an embodiment of the invention. In the illustrated example, the block is distributed and segmented along a single word line 80. In other words, the block is distributed in isolated virtual ground array slices 81 and 83, which are separated from each other respectively by isolated slices 82 and 84 to which the block does not belong. WL 80 is preferably raised from a low voltage level (e.g., 0 V) to a high read level (e.g., 3.5 V) only once per a full block read.

The contents of the block are preferably read by consecutive read operations. Each of the consecutive read operations may comprise parallel accessing of a subset of the block's bits and reading the contents. Alternatively, instead of parallel read operations, the bits may be read serially or in any other arrangement. The subset preferably contains at least one bit of that block. In the illustrated example, each of the bits in the subset is placed in a different isolated VG array slice 81 and 83. If two bits of a block that are accessed in parallel would be placed in the same isolated VG array slice, then reading one of the bits may affect the readout result of the other bit. Accordingly, it may be advantageous to avoid parallel accessing more than one bit in an isolated VG array slice. In FIG. 6A, a first subset comprises the left bits 85 and 86 of the cells between the first two bit lines of isolated slices 81 and 83, respectively.

Read access to each of the bits in the subset may be obtained by proper configuration of the YMUX 57 and the array select transistors 49 (FIG. 4) such that a relatively low positive voltage (e.g., 1.6 V) and a close to ground voltage (~0 V) are driven to the drains and sources, respectively, of the left-side bits in the subset. All the other bit lines are preferably floating. It is noted that for NROM cells, since the word line voltage in this example is high (e.g., 3.5 V), the current flowing through each of the accessed NROM cells determines the source side bit state.

Various methods for reading or sensing the cells state may be used. These methods may comprise either directly sensing the currents of the cells or converting the currents of the cells into voltage signals. The cells may be sensed either from their drain or source side. A preferred method of reading or sensing the cell currents and determining the corresponding state (programmed or erased) is described in U.S. Pat. No. 6,011,725, the disclosure of which is incorporated herein by reference.

After reading the first subset of the block's bits, the YMUX 57 and/or the array select transistors 49 are preferably re-configured in order to access the LBLs of another subset of the block's bits. For example, in FIG. 6B, the next (i.e., second) subset comprises the right bits 87 and 88 of the cells between the first two bit lines of isolated slices 81 and 83, respectively. The new subset may then be read in parallel, serially or any other arrangement.

Consecutive accesses to subsets of the block's bits preferably continue until all the block's bits are read out. For example, in FIG. 6C, the last subset comprises the right bits 89 and 90 of the cells between the last two bit lines of isolated slices 81 and 83, respectively.

The subsets of bits accessed in the read operation (parallel, serially or any other arrangement) may be, but are not necessarily, equal in size. The subsets of bits accessed in the read operation may be, but are not necessarily, located at the same location in the VG slice where each of the other subset's bits is located (as in FIGS. 6A–6C).

The data read out from each subset may be stored in a memory location, such as, but not limited to, a buffer or an external circuit (both not shown), while accessing or reading the next subset of bits from the array.

It is noted that the read operation is not limited to a full block read. Rather, a read operation may be performed such that only part of a block is read out, in which case the YMUX 57 and the array select transistors 49 (FIG. 4) are preferably accordingly configured.

Figure 7A:
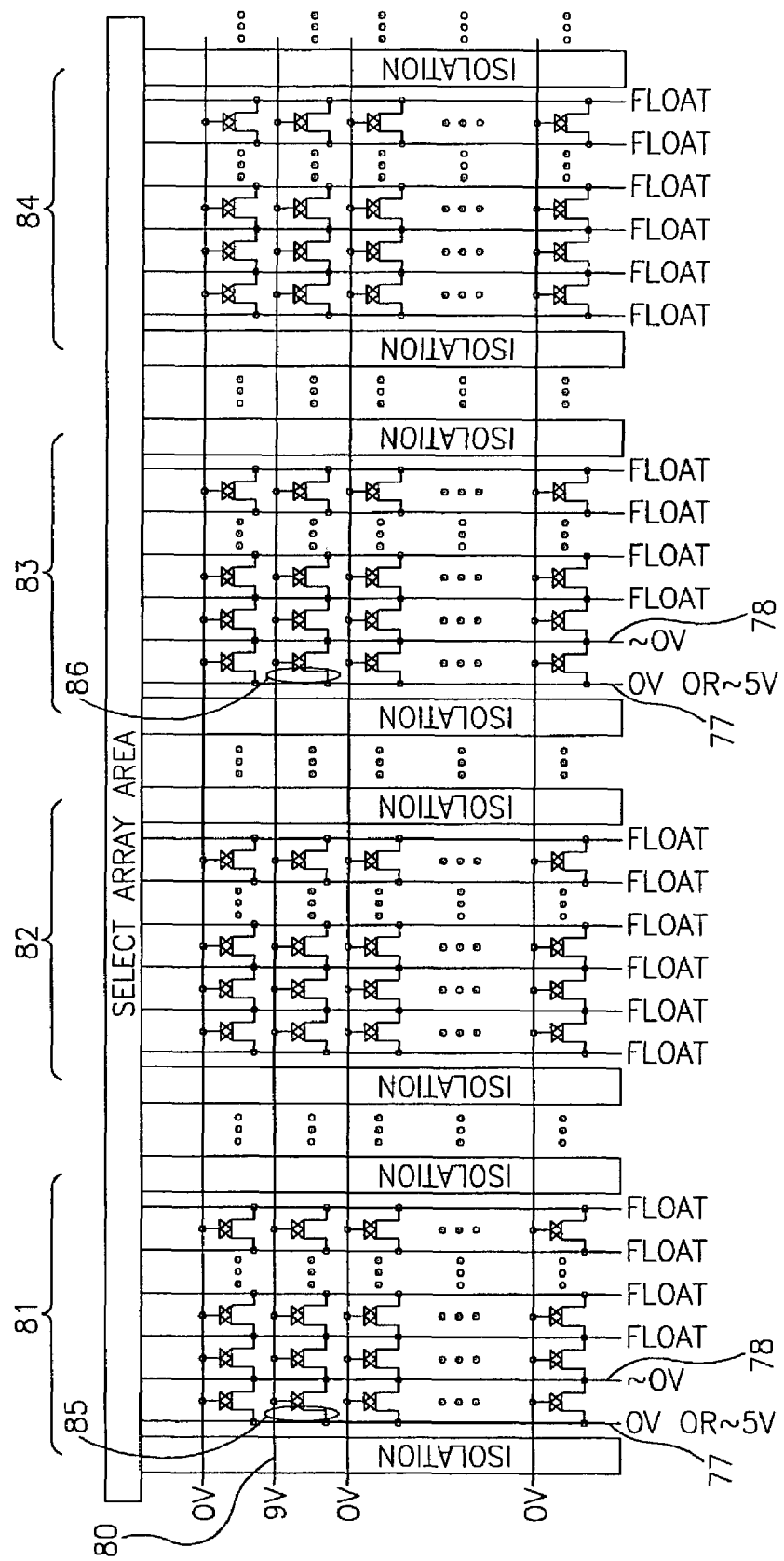
FIGS. 7A and 7B are simplified illustrations of programming bits in a block, in accordance with an embodiment of the invention.
Figure 7B:
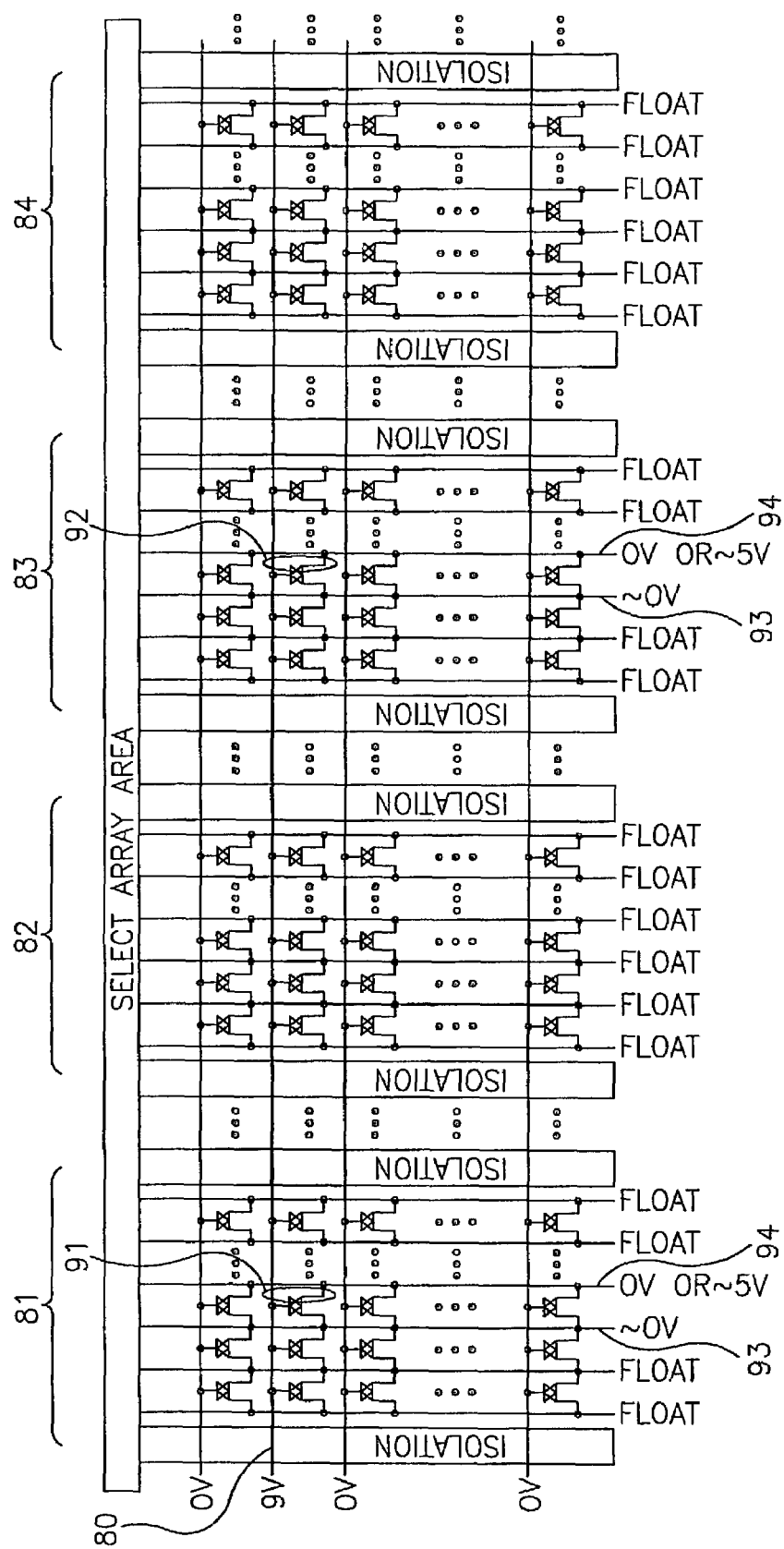

Reference is now made to FIGS. 7A and 7B, which illustrate an example of programming bits in a block, in accordance with an embodiment of the invention. Programming a block may comprise applying at least one programming pulse to each bit whose state is to be changed from non-programmed to programmed. For example, a method of programming bits of cells with programming pulses is described in U.S. patent application Ser. No. 09/730,586, entitled "Programming And Erasing Methods For An NROM Array", the disclosure of which is incorporated herein by reference.

As in FIGS. 6A–6C, the block may be distributed and segmented along word line 80 in isolated virtual ground array slices 81 and 83. WL 80 is preferably raised to a programming voltage level (e.g., 9 V) only once per a full block programming pulse. The term "a full block programming pulse" refers to applying a programming pulse to all those bits in the block which are to be programmed. In other words, the programming pulse may be applied to a subset of the block's bits that are to be programmed. All the bits in an accessed subset may be applied with a programming pulse in parallel or in separate pulses, wherein for each pulse, the threshold voltage of at least one bit is expected to be increased with the programming pulse.

In FIG. 7A, a first programming pulse is applied to a first subset that comprises the left bits 85 and 86 of the cells between the first two bit lines of isolated slices 81 and 83, respectively. Word line 80 is at the programming voltage, e.g., 9 V. The YMUX 57 and the array select transistors 49 (FIG. 4) drive the bit lines to voltages suitable for programming. For example, for NROM cells, the leftmost bit line 77 of the first two bit lines of isolated slices 81 and 83 serves as the drain and may be driven to a voltage of 0V or in the range of 5V. The 0V voltage may be driven in the event that the accessed bit in that slice does not have to be programmed (e.g., if it is an erased bit and should remain in its erased state, or if it is an already programmed bit). The positive voltage that causes programming, e.g., 5V, may be driven in the event that the accessed bit in that slice should have a programming pulse applied thereto. The adjacent bit line 78 serves as the source and may be grounded. Other bit lines may be floating. After applying the programming pulse(s) to the first subset, the YMUX 57 and/or the array select transistors 49 may be re-configured in order to access another subset of the block's bits, such as the right bits 91 and 92 of the cells between bit lines 93 and 94 of isolated slices 81 and 83, respectively, as seen in FIG. 7B. Another programming pulse may then be applied to the new subset. Word line 80 is still at the programming voltage, e.g., 9 V. For NROM cells, since the bit to be programmed is now the right-side bit, the more-right bit line 94 serves as the drain and may be driven to a programming voltage level (e.g., 5V) if that bit should be applied with a programming pulse, or to a non-programming voltage level (e.g., 0V) if that bit should not be applied with a programming pulse. The more-left bit line 93 serves as the source and may be grounded.

Consecutive accesses to subsets of the block's bits preferably continue until all the block's bits that are to be programmed are applied with a programming pulse. At this stage, the block's bits that were applied with a programming pulse are verified in order to check if they reached their target programmed state. Any bit that fails the program verify operation should preferably be applied with another programming pulse. Accordingly, a new sequence may be started of accessing subsets of the block's bits in order to apply programming pulses to at least part of the subset bits, as described hereinabove, and may be completed after applying programming pulses to all the block's bits that required such pulses. In this phase, the programming pulse duration or the voltages levels may vary, depending on the exact programming algorithm being used. An example of a preferred algorithm for NROM cells is a slight increase in the programming pulse level above the previous phase (e.g., 5.2V in the present phase, if 5V were applied in the previous phase). This programming pulse phase is again preferably followed by a program verify phase. This sequence of programming and program verification preferably continues until all the bits that had to be programmed pass the program verify phase.

It is noted that programming may also comprise applying one or more pulses to a subset, and only after verifying that the programming level has been reached, proceeding to program the next subset. Alternatively, the programming may comprise applying one or more pulses to a subset and proceeding to one or more subsequent subsets and only afterwards verifying if the programming level has been reached.

The subsets of bits accessed in the program operation (parallel, serially or any other arrangement) may be, but are not necessarily, equal in size. The subsets of bits accessed in the program operation may be, but are not necessarily, located at the same location in the VG slice where each of the other subset's bits is located (as in FIGS. 7A and 7B).

The programming operation is not limited to a full block. Rather programming may be performed on any smaller subset (e.g. a single bit, a few bytes, etc.), wherein the YMUX 57 and the array select transistors 49 (FIG. 4) are preferably configured accordingly.

Figure 8A:
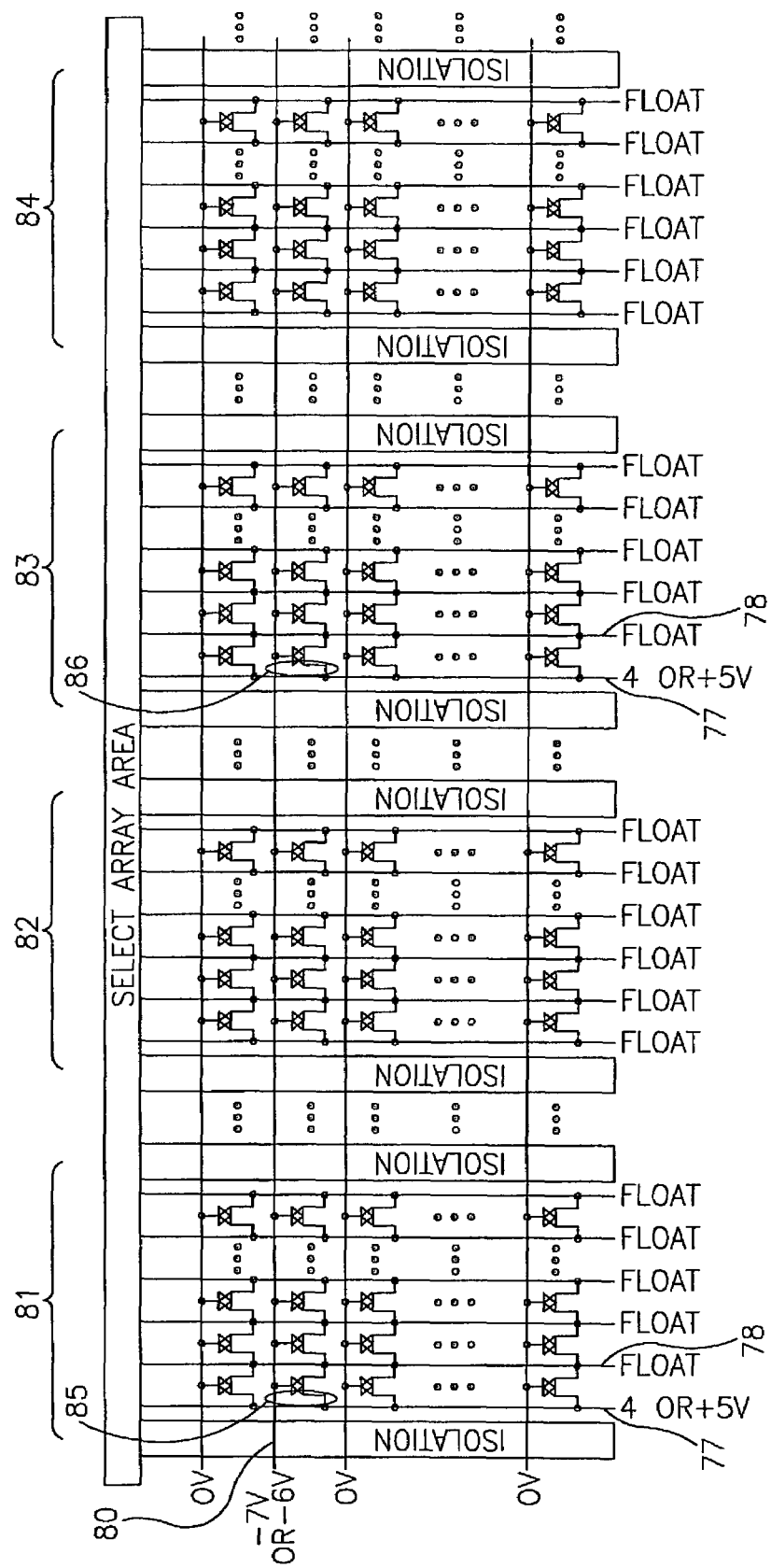
FIGS. 8A and 8B are simplified illustrations of erasing bits in a block, in accordance with an embodiment of the invention.
Figure 8B:
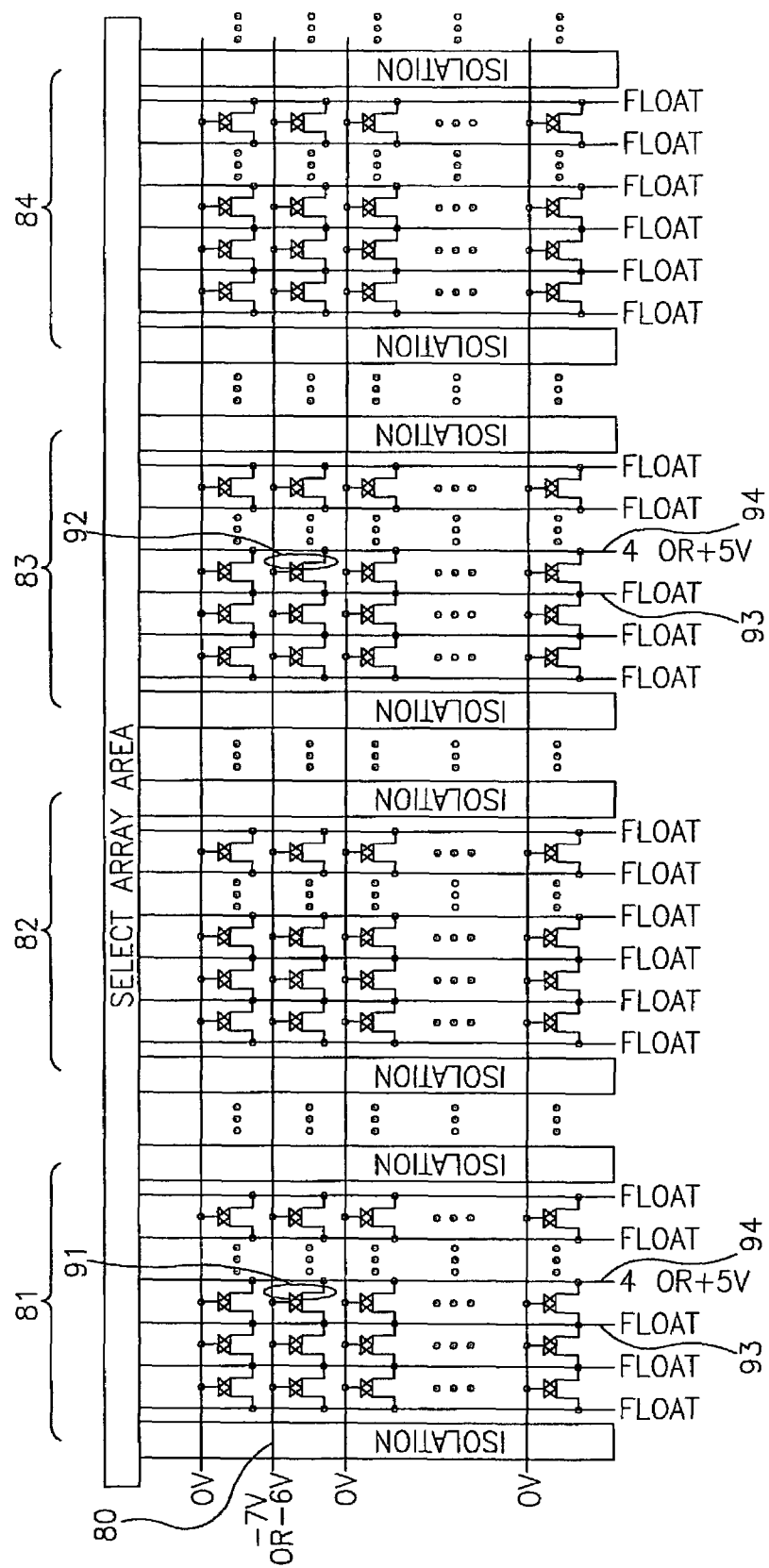

Reference is now made to FIGS. 8A and 8B, which illustrate an example of erasing bits in a block, in accordance with an embodiment of the invention. Erasing a block may comprise applying at least one erasing pulse to each bit whose state is to be changed from non-erased to erased. For example, a method of erasing bits of cells with erasing pulses is described in U.S. Pat. No. 6,011,725 mentioned hereinabove.

As in FIGS. 6A–6C, the block may be distributed and segmented along word line 80 in isolated virtual ground array slices 81 and 83. WL 80 is preferably lowered to an erasing voltage level (e.g., −6 or −7 V) only once per a full block erasing pulse. The term "a full block erasing pulse" refers to applying an erasing pulse to all those bits in the block which are to be erased. In other words, the erasing pulse may be applied to a subset of the block's bits that are to be erased. All the bits in an accessed subset may be applied with an erasing pulse in parallel or in separate pulses, wherein for each pulse, the threshold voltage of at least one bit is expected to be decreased with the erasing pulse.

In FIG. 8A, a first erasing pulse is applied to a first subset that comprises the left bits 85 and 86 of the cells between the first two bit lines of isolated slices 81 and 83, respectively. Word line 80 is at the erasing voltage, e.g., −6 or −7 V. The YMUX 57 and the array select transistors 49 (FIG. 4) drive the bit lines to voltages suitable for erasing. For example, for NROM cells, the bit line 77 serves as the drain and may be driven to a voltage in the range of 4–5 V. The bit line 78 serves as the source and may be floating. Other bit lines may be floating. The threshold voltages of the bits may be verified and further erasing pulses may be applied before proceeding to the next subset.

After applying the erasing pulse(s) to the first subset, the YMUX 57 and/or the array select transistors 49 may be re-configured in order to access another subset of the block's bits, such as the right bits 91 and 92 of the cells between bit lines 93 and 94 of isolated slices 81 and 83, respectively, as seen in FIG. 8B. Another erasing pulse may then be applied to the new subset. Word line 80 is still at the erasing voltage, e.g., −6 or −7 V. For NROM cells, since the bit to be erased is now the right-side bit, the bit line 94 serves as the drain and may be driven to a voltage in the range of 4–5 V. The bit line 93 serves as the source and may be floating.

Consecutive accesses to subsets of the block's bits preferably continue until all the block's bits that are to be erased are erased. It is noted that erasing may comprise applying one or more pulses to a subset, and only after verifying that the erasing level has been reached, proceeding to erase the next subset. Alternatively, the erasing may comprise applying one or more pulses to a subset and proceeding to one or more subsequent subsets and only afterwards verifying if the erasing level has been reached.

The subsets of bits accessed in the erase operation (parallel, serially or any other arrangement) may be, but are not necessarily, equal in size. The subsets of bits accessed in the erase operation may be, but are not necessarily, located at the same location in the VG slice where each of the other subset's bits is located (as in FIGS. 8A and 8B).

The erasing operation is not limited to a full block. Rather erasing may be performed on any smaller subset (e.g. a single bit, a few bytes, etc.), wherein the YMUX 57 and the array select transistors 49 (FIG. 4) are preferably configured accordingly.

The erasing operation may be performed on an erase sector (E-sector). Erasing an E-sector comprises applying at least one erase pulse to each of the block's bits in the particular E-sector, or alternatively at least to each of the block's bits in the E-sector that are to be erased. The word lines on which the blocks of the E-sector are distributed may be driven to a negative erase level (e.g. −6 or −7 V) only once per a full E-sector erase pulse. Erasing may then proceed as described hereinabove for erasing bits in a block.

It will be appreciated by persons skilled in the art that the present invention is not limited by what has been particularly shown and described herein above. Rather the scope of the invention is defined by the claims that follow:

What is claimed is:

1. A method for operating a virtual ground array in a mass storage device wherein said virtual ground array comprises at least one block of data stored in bits along at least one word line, and said operating comprises performing consecutive accesses to subsets of the bits of said at least one block along said at least one word line.

2. The method according to claim 1 wherein said performing consecutive accesses comprises performing parallel accessing of at least one subset of the bits of said at least one block, wherein said at least one subset comprises at least one bit of said at least one block.

3. The method according to claim 1 wherein said performing consecutive accesses comprises performing serial accessing of said at least one subset of the bits of said at least one block, wherein said at least one subset comprises at least one bit of said at least one block.

4. The method according to claim 1 and further comprising performing consecutive accesses to said subsets until a portion of the bits of said at least one block are operated upon.

5. The method according to claim 1 and further comprising performing consecutive accesses to said subsets until all the bits of said at least one block are operated upon.

6. The method according to claim 1 wherein said performing consecutive accesses comprises accessing equal-sized subsets of bits.

7. The method according to claim 1 wherein said performing consecutive accesses comprises accessing unequal-sized subsets of bits.

8. The method according to claim 1 wherein said virtual ground array comprises isolated slices along said at least one word line, and said performing consecutive accesses comprises accessing subsets of bits that are located at the same location in at least two of said virtual ground isolated slices.

9. The method according to claim 1 wherein said operating comprises reading data from one of said subsets and storing said data in a memory location while accessing another one of said subsets.

10. The method according to claim 1 wherein said operating comprises driving said at least one word line to an operating voltage level once per a block operation.

11. A mass storage non-volatile memory device, comprising a virtual ground array that includes memory cells connected in rows and columns to word lines and bit lines, respectively, wherein at least one block of data is stored in bits along at least one word line, to enable consecutive accesses to subsets of the bits.

12. The mass storage non-volatile memory device according to claim 11 wherein said at least one block of data is stored in bits along more than one word line.

13. The mass storage non-volatile memory device according to claim 11 wherein said at least one block of data is partitioned into isolated slices.

14. The mass storage non-volatile memory device according to claim 13 wherein said isolated slices are arranged continuously on a word line.

15. The mass storage non-volatile memory device according to claim 13 wherein said isolated slices are arranged in separate segments on a word line.

16. The mass storage non-volatile memory device according to claim 13 wherein said isolated slices are accessible in parallel.

17. The mass storage non-volatile memory device according to claim 13 wherein said isolated slices are segmented along said bit lines by select transistors into isolated physical sectors (P-sectors).

18. The mass storage non-volatile memory device according to claim 17 wherein a bit line in at least one of said P-sectors comprises a local bit line (LBL) connected through a select transistor to a global bit line (GBL).

19. The mass storage non-volatile memory device according to claim 18 wherein different LBLs corresponding to different P-sectors share a common GBL.

20. The mass storage non-volatile memory device according to claim 18 wherein different LBLs within a P-sector share a common GBL.

21. The mass storage non-volatile memory device according to claim 13 wherein at least one bit in at least one of said isolated slices is accessible through a global bit line.

22. The mass storage non-volatile memory device according to claim 11 and further comprising row decoding circuitry and at least one word line driver adapted to provide access and drive voltages to said word lines.

23. The mass storage non-volatile memory device according to claim 11 wherein at least one of said memory cells comprises a non-conducting charge trapping layer.

24. The mass storage non-volatile memory device according to claim 23 wherein at least one of said memory cells is a nitride, read only memory (NROM) cell.

25. A method for operating a sliced virtual ground array in a mass storage device, said virtual ground array including a plurality of memory cells connected in rows and columns to word lines and bit lines, respectively, the method comprising:

consecutively accessing along at least one word line a plurality of subsets of at least one block of data stored in said memory cells.

26. The method according to claim 25 wherein said operating comprises at least one of reading, programming and erasing.

27. A mass storage non-volatile memory device comprising:
- a sliced virtual ground array, mass storage non-volatile memory device, comprising having memory cells connected in rows and columns to word lines and bit lines, respectively, wherein said virtual ground array comprises at least one block of data; and
- peripheral circuitry adapted to consecutively access a plurality of subsets of said at least one block of data stored in said memory cells along at least one word line.

* * * * *